(12) United States Patent
Shimazawa

(10) Patent No.: US 6,529,353 B2
(45) Date of Patent: Mar. 4, 2003

(54) MAGNETORESISTIVE TUNNEL JUNCTION ELEMENT WITH BIAS MAGNETIC FIELD APPLYING LAYER

(75) Inventor: Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/987,854

(22) Filed: Nov. 16, 2001

(65) Prior Publication Data

US 2002/0097537 A1 Jul. 25, 2002

(30) Foreign Application Priority Data

Nov. 27, 2000 (JP) .................................. 2000-358728

(51) Int. Cl.[7] .............................. G11B 5/127; G11B 5/39
(52) U.S. Cl. .................................................. 360/324.2
(58) Field of Search .............................. 360/324.2, 324, 360/313, 110, 324.1, 324.12, 327.32, 327.3

(56) References Cited

U.S. PATENT DOCUMENTS

| | | | | |
|---|---|---|---|---|
| 5,739,987 A | * | 4/1998 | Yuan et al. ............ | 360/327.32 |
| 5,959,810 A | * | 9/1999 | Kakihara et al. ...... | 360/324.12 |
| 6,266,218 B1 | * | 7/2001 | Carey et al. .......... | 360/324.12 |
| 6,344,954 B1 | | 2/2002 | Redon et al. ............ | 360/324.2 |

FOREIGN PATENT DOCUMENTS

| | | |
|---|---|---|
| JP | 4-103014 | 4/1992 |
| JP | 2001-6127 | 1/2001 |
| JP | 2001-6130 | 1/2001 |
| JP | 2001-15826 | 1/2001 |

* cited by examiner

*Primary Examiner*—Brian E. Miller
*Assistant Examiner*—Julie Anne Watko
(74) *Attorney, Agent, or Firm*—Oblon, Spivak, McClelland, Maier & Neustadt, P.C.

(57) ABSTRACT

There is disclosed a magnetoresistive tunnel junction element comprising a tunnel multilayered film in which a tunnel barrier layer, and a ferromagnetic free layer and a ferromagnetic pinned layer formed to sandwich the tunnel barrier layer therebetween are laminated, wherein a pinning layer for pinning magnetization of the ferromagnetic pinned layer is laminated on the surface of the ferromagnetic pinned layer opposite to the surface thereof contacting the tunnel barrier layer, a bias magnetic field applying layer is formed on the surface of the ferromagnetic free layer opposite to the surface thereof contacting the tunnel barrier layer, the bias magnetic field applying layer is a laminate of a nonmagnetic noble metal layer and an antiferromagnetic layer, and the ferromagnetic free layer is magnetically exchange-coupled to the antiferromagnetic layer via the nonmagnetic noble metal layer so that a bias magnetic field can be applied to the ferromagnetic free layer, and therefore stability of a magnetization rotating operation of the free layer with respect to a magnetic field signal is superior.

11 Claims, 4 Drawing Sheets

MAGNETORESISTIVE TUNNEL JUNCTION ELEMENT WITH BIAS MAGNETIC FIELD APPLYING LAYER

BACKGROUND OF THE INVENTION

1. Field of the Invention

The present invention relates to a magnetoresistive tunnel junction element for reading a magnetic field intensity from a magnetic recording medium or the like as a signal and, in particular, to a magnetoresistive tunnel junction element which has inventive biasing means and which is superior in stability of a detecting operation with respect to an external magnetic field signal.

2. Description of the Prior Art

An MR sensor based on an anisotropic magnetoresistance (AMR) or spin-valve (SV) effect is well known as a reading transducer of magnetic recording. The MR sensor can detect a change of a signal recorded in a recording medium by a resistance change of a reading portion formed of a magnetic material. An AMR sensor has a low resistance change ratio $\Delta R/R$ of the order of 1 to 3%, whereas an SV sensor has a high resistance change ratio $\Delta R/R$ of the order of 2 to 7%. An SV magnetic reading head indicating such high sensitivity is replacing an AMR reading head to enable reading of a very high recording density, for example, of several gigabits per square inch ($Gbits/in^2$).

In recent years, a new MR sensor has attracted attention for its application potential in ultra-high density recording. That is, it has been reported that magnetoresistive tunnel junctions (referred to as MRTJ, or synonymously TMR) indicate the resistance change ratio $\Delta R/R$ of 12% or more. Although a TMR sensor is expected to replace the SV sensor as a next-generation sensor, an application to a magnetic head has just started, and one of outstanding problems is to develop an inventive head structure which can maximize TMR properties. That is, the TMR sensor itself has a so-called current perpendicular to the plane (CPP) geometry in which a current is passed in a thickness direction of a laminated film. Therefore, there has been a demand for a design of a new head structure which has not heretofore been proposed.

An example of application of a TMR element to a magnetic head structure is described, for example, in Japanese Patent Application Laid-Open No. 282616/1997. An element structure disclosed in the publication includes: a first magnetic layer (so-called free layer) formed of a soft magnetic material; a second magnetic layer (so-called pinned layer) having a magnetization direction crossing at right angles to a magnetization direction in an initial state of the first magnetic layer; an antiferromagnetic layer formed on the second magnetic layer; and an insulating layer, disposed between the first magnetic layer and the second magnetic layer, for tunnel-joining the magnetic layers to each other. Furthermore, respective bias magnetic layers formed of ferromagnetic materials such as CoCrPt are disposed on opposite ends of the first magnetic layer. The magnetization direction in the initial state of the first magnetic layer is regulated in a direction from one bias magnetic layer to the other bias magnetic layer by a magnetic field from the bias magnetic layer.

A rising portion of an MR curve is defined by magnetization rotation of the first magnetic layer (free layer). In order to obtain a steeper rising of the MR curve, it is preferable to completely change the magnetization direction of the first magnetic layer (free layer) with respect to a magnetic field signal by magnetization rotation. However, in actual a magnetic domain is generated in the first magnetic layer (free layer), and movement of a magnetic wall and rotation of magnetization simultaneously occur with respect to the magnetic field signal. As a result, Barkhausen noise is generated, and a problem occurs that MR head property is not stabilized. To solve the problem, the bias magnetic layers are disposed on the opposite ends of the first magnetic layer.

However, TMR has a special structure in which layers for generating a bias magnetic field (bias magnetic layers) are brought into contact only with the first magnetic layer. Therefore, it cannot be said that hard magnets have a sufficient effect in the aforementioned conventional arrangement structure of the bias magnetic layers, and instability of a magnetization rotating operation of the first magnetic layer (free layer) with respect to the magnetic field signal still remains unsolved. As a result, yield of a product in manufacturing of TMR element is remarkably bad, and this is a large problem in the manufacturing of TMR element.

SUMMARY OF THE INVENTION

The present invention has been developed under these circumstances, and an object thereof is to provide a magnetoresistive tunnel junction element which has an inventive bias magnetic field applying structure superior in stability of a magnetization rotating operation of a free layer with respect to a magnetic field signal.

To achieve the object, according to the present invention, there is provided a magnetoresistive tunnel junction element having a tunnel multilayered film in which a tunnel barrier layer, and a ferromagnetic-free layer and ferromagnetic pinned layer formed to sandwich the tunnel barrier layer therebetween are laminated, wherein a pinning layer for pinning magnetization of the ferromagnetic pinned layer is laminated on the surface of the ferromagnetic pinned layer opposite to the surface thereof contacting the tunnel barrier layer, a bias magnetic field applying layer is formed on the surface of the ferromagnetic free layer opposite to the surface thereof contacting the tunnel barrier layer, the bias magnetic field applying layer is a laminate of a nonmagnetic noble metal layer and an antiferromagnetic layer, and the ferromagnetic free layer is magnetically exchange-coupled to the antiferromagnetic layer via the nonmagnetic noble metal layer so that a bias magnetic field can be applied to the ferromagnetic free layer.

Moreover, according to a preferred embodiment of the present invention, the nonmagnetic noble metal layer is constituted of Cu, Ag, Au, Ir, Ru, Rh or Cr.

Furthermore, according to another preferred embodiment of the present invention, a thickness of the nonmagnetic noble metal layer is set to a range of 0.5 to 6.0 nm, so that a strength of the magnetic exchange coupling between the antiferromagnetic free layer and the antiferromagnetic layer can arbitrarily be set.

Additionally, according to another preferred embodiment of the present invention, the bias magnetic field applying layer is constituted to contact the whole one surface of the ferromagnetic free layer.

Moreover, according to another preferred embodiment of the present invention, a pair of bias applying means are formed to contact opposite ends of the ferromagnetic free layer in a direction in which the bias magnetic field is applied, and the bias applying means is constituted to further apply the bias magnetic field to the ferromagnetic free layer.

Furthermore, according to another preferred embodiment of the present invention, extended portions extended beyond positions of opposite ends of the ferromagnetic pinned layer in a longitudinal direction (bias magnetic field applying direction) are formed on opposite ends of the ferromagnetic free layer, the bias applying means is formed to partially contact the extended portion of the ferromagnetic free layer, and the bias applying means is constituted to apply the bias magnetic field to the ferromagnetic free layer.

Additionally, according to another preferred embodiment of the present invention, the bias applying means includes a hard magnet layer or an antiferromagnetic layer.

Moreover, according to another preferred embodiment of the present invention, the ferromagnetic free layer is constituted of a synthetic ferrimagnet.

Furthermore, according to another preferred embodiment of the present invention, the tunnel multilayered film is electrically connected to a pair of electrodes disposed opposite to each other via the tunnel multilayered film.

Additionally, according to another preferred embodiment of the present invention, the nonmagnetic noble metal layer is constituted to promote the magnetic exchange coupling between the ferromagnetic free layer and the antiferromagnetic layer.

DETAILED DESCRIPTION OF THE INVENTION

Concrete embodiments of the present invention will be described hereinafter in detail.

Figure 1:
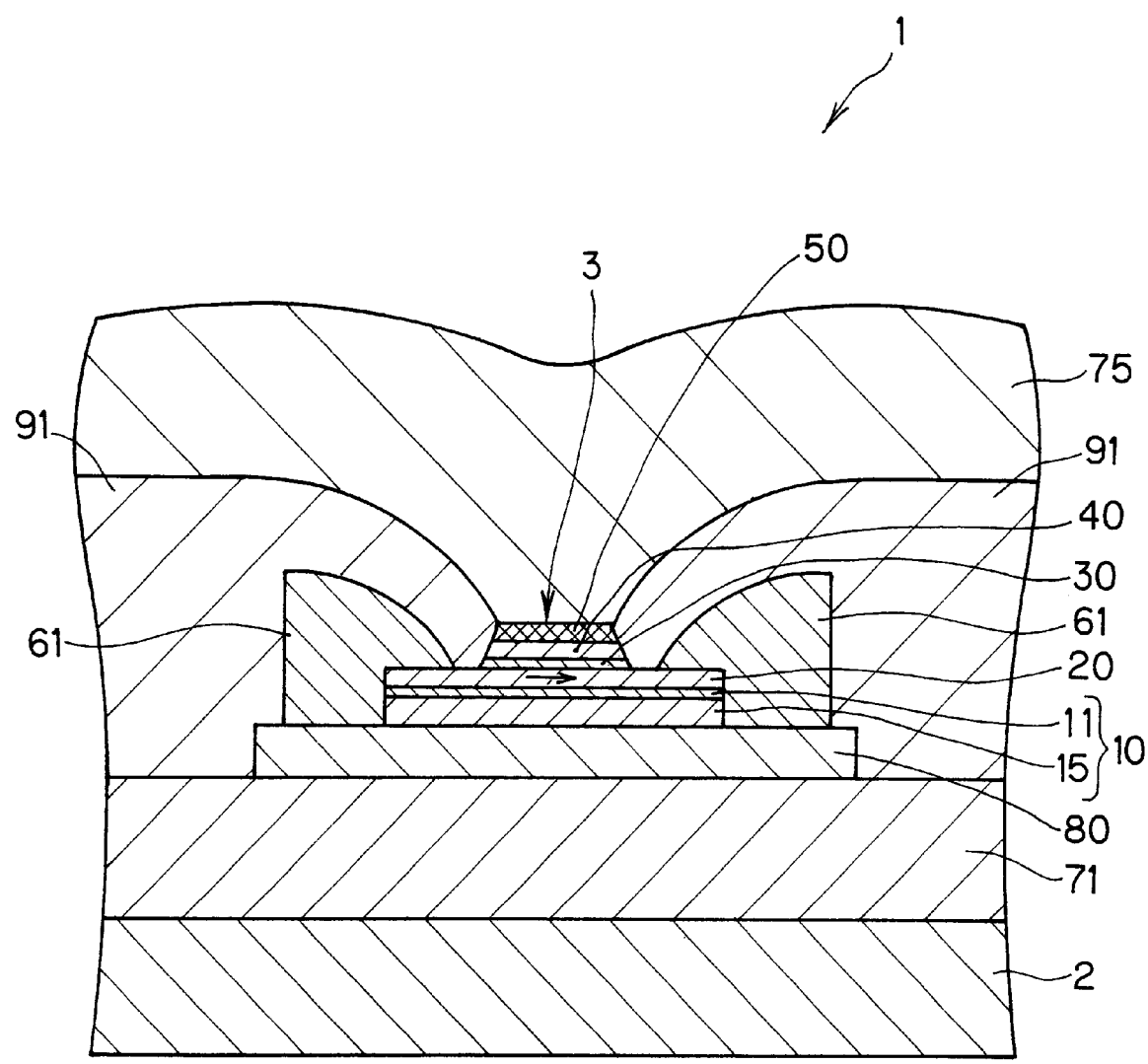
FIG. 1 is a sectional view showing a preferred embodiment of a magnetoresistive tunnel junction head of the present invention.
Figure 2:
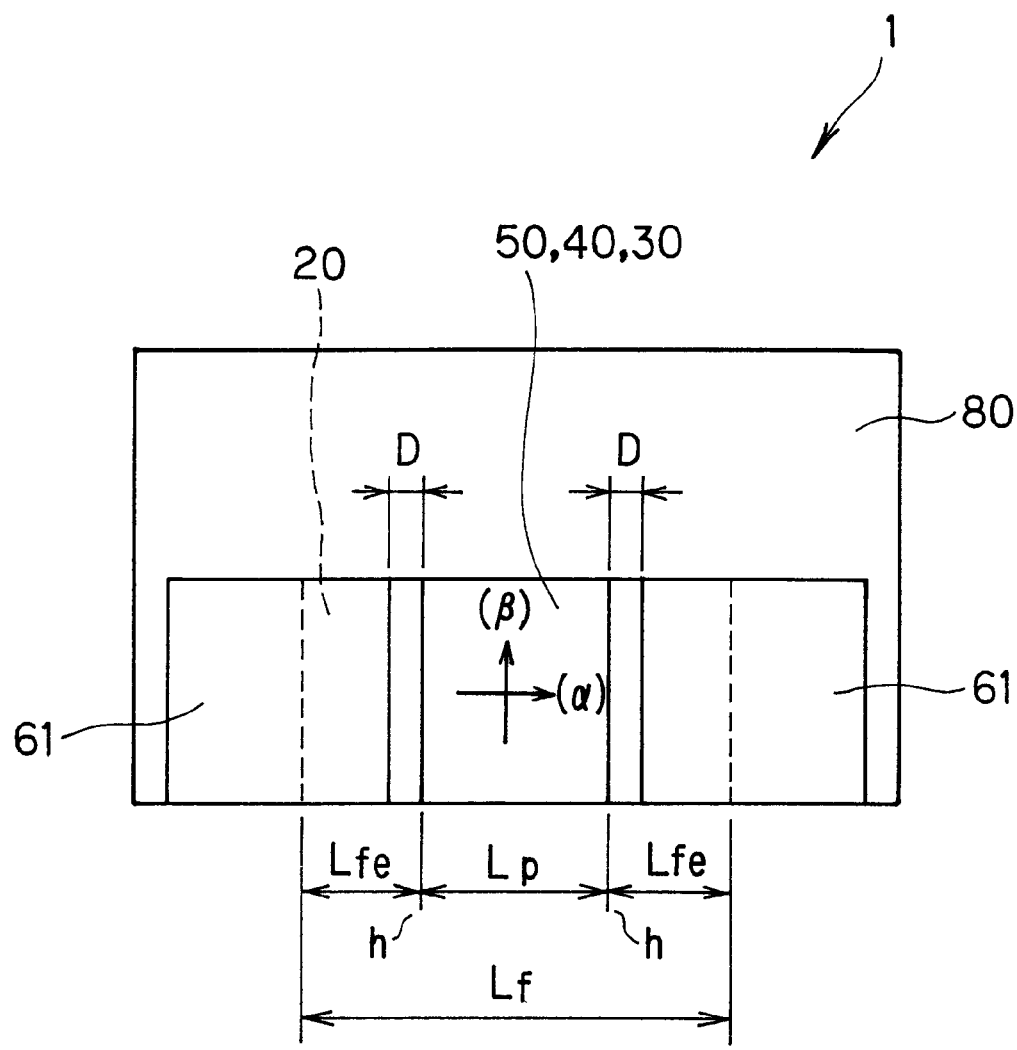
FIG. 2 is a plan view showing a main part of FIG. 1.

FIG. 1 is a schematic sectional view showing a preferred embodiment of a magnetoresistive tunnel junction element 1 of the present invention (hereinafter referred to simply as "TMR element 1", and the "element" mentioned in the present specification has a broad concept including a so-called magnetic head structure). This sectional view shows an air bearing surface (ABS) disposed substantially opposite to a recording medium which emits an external magnetic field as magnetic information. FIG. 2 is a plan view showing a main part of FIG. 1.

In the present embodiment, the TMR element 1 shows one example of a TMR magnetic head structure, and has a tunnel multilayered film 3 which indicates a spin magnetoresistive tunnel junction effect. That is, the tunnel multilayered film 3 has a multilayered film structure in which a tunnel barrier layer 30, and a ferromagnetic free layer 20 and a ferromagnetic pinned layer 40 formed to sandwich the tunnel barrier layer 30 therebetween are laminated. The ferromagnetic free layer 20 operates to freely change a direction of magnetization in response to a magnetic field signal from the outside which is basically magnetic information.

Moreover, the ferromagnetic pinned layer 40 has the magnetization pinned, for example, by a pinning layer 50 formed of an antiferromagnetic layer so that a magnetization direction is entirely fixed in one direction. The pinned magnetization direction is a depth direction of the drawing sheet of FIG. 1, and is a direction of an arrow (β) in FIG. 2. That is, as shown in FIG. 1, the pinning layer 50 for pinning the magnetization of the ferromagnetic pinned layer 40 is usually formed on the surface of the ferromagnetic pinned layer 40 opposite to the surface thereof contacting the tunnel barrier layer 30.

As shown in FIG. 2, the tunnel multilayered film 3 may be constituted such that a multilayered film detection end surface entirely constitutes an air bearing surface (ABS), or only the ferromagnetic free layer 20 may slightly be projected.

In the present invention, as shown in FIG. 1, a bias magnetic field applying layer 10 is formed on the whole one surface of the ferromagnetic free layer 20 opposite to the surface thereof contacting the tunnel barrier layer 30. The bias magnetic field applying layer 10 has a laminate constituted of a nonmagnetic noble metal layer 11 and antiferromagnetic layer 15, and the nonmagnetic noble metal layer 11 and antiferromagnetic layer 15 are formed in order from a side of the ferromagnetic free layer 20. Thereby, the magnetization of the ferromagnetic free layer 20 is exchange-coupled to the magnetization of the antiferromagnetic layer via the nonmagnetic noble metal layer 11, and a bias magnetic field can be applied to the ferromagnetic free layer 20 (in a horizontal arrow direction of FIG. 1; direction of an arrow (α) in FIG. 2).

Examples of a material of the nonmagnetic noble metal layer 11 include Cu, Ag, Au, Ir, Ru, Rh, Cr, and the like, and Cu, Ag, Au, particularly Ag are preferably used among these metals. A thickness of the nonmagnetic noble metal layer 11 is in a range of 0.5 to 6.0 nm, preferably 2.5 to 5.5 nm. When this value exceeds 6.0 nm, an exchange coupling magnetic field from the antiferromagnetic layer 15 is disadvantageously excessively weakened. Moreover, when this value is less than 0.5 nm, the exchange coupling magnetic field is excessively strengthened, a magnetic field sensitivity of the ferromagnetic free layer 20 is dulled, and an output is disadvantageously deteriorated. In the present invention, when the thickness of the nonmagnetic noble metal layer 11 is appropriately changed in the aforementioned range, a strength of magnetic exchange coupling between the ferromagnetic free layer 20 and the antiferromagnetic layer 15, that is, a strength of bias magnetic field can arbitrarily be set. Moreover, from results of experiments conducted by the present inventors as described later, it is considered that the nonmagnetic noble metal layer 11 in the present invention may promote the magnetic exchange coupling between the ferromagnetic free layer 20 and the antiferromagnetic layer 15. In other words, it is possible to perform a thermal annealing treatment for determining the applying direction of the bias magnetic field at a temperature lower than a temperature which is to be originally used.

The bias magnetic field applying layer 10 in the present invention is preferably in substantial contact with the whole one surface of the ferromagnetic free layer 20. In this constitution, a weak bias magnetic field can securely and substantially uniformly be applied to the whole ferromagnetic free layer 20 in the direction of arrow (α). This can reduce generation of Barkhausen noise or a level of the noise, and a head tends to operate remarkably steadily.

The bias magnetic field applying layer 10 will further be described. In the conventional exchange coupling of the magnetization between the ferromagnetic layer and antiferromagnetic layer, these layers have to be directly coupled to each other. However, in this case, the strength of the exchange coupling magnetic field is excessively large, and the magnetic field is not practical as the bias magnetic field contacting and acting on the whole surface of the ferromagnetic free layer 20. Then, in the present invention, it has been experimentally found that the exchange coupling of the magnetization between the ferromagnetic free layer 20 and the antiferromagnetic layer 15 can be realized via the nonmagnetic noble metal layer 11 having predetermined material and thickness, the strength of the coupling can arbitrarily be adjusted, and the exchange coupling is effectively utilized particularly for the TMR element unstable in operation. Therefore, the bias magnetic field applying layer 10 is formed on the whole one surface of the ferromagnetic free layer 20.

For the bias magnetic field to the ferromagnetic free layer 20, in addition to the bias magnetic field applying layer 10, a pair of bias applying means 61, 61 are formed in contact with opposite ends of the ferromagnetic free layer 20 in the direction in which the bias magnetic field is applied (horizontal arrow direction in FIG. 1; direction of arrow (α) in FIG. 2). Thereby, the bias magnetic field is preferably applied to the ferromagnetic free layer 20 by the bias applying means 61, 61. This is because a particularly large local bias magnetic field is necessary for movement of a magnetic wall in the opposite ends.

Concretely, as shown in FIG. 1, the bias magnetic field is applied to the ferromagnetic free layer 20 in a longitudinal direction of the ferromagnetic free layer 20 (direction of arrow (α) of FIG. 2) by the bias applying means 61, 61 which are laminated, connected and disposed in the opposite ends of the ferromagnetic free layer in the longitudinal direction (left and right direction of the drawing sheet) as shown in FIG. 1. The bias applying means 61, 61 include a hard magnet layer or an antiferromagnetic layer.

As shown in FIG. 2, a length $L_f$ of the ferromagnetic free layer 20 in the longitudinal direction (substantially the same as the bias magnetic field applying direction) is set to be greater than a longitudinal length $L_p$ of the ferromagnetic pinned layer 40. The ferromagnetic free layer 20, which has the length $L_f$ greater than the length $L_p$ of the ferromagnetic pinned layer 40, has extended portions extending further beyond opposite ends of the ferromagnetic pinned layer 40 in the longitudinal direction (shown by a leader line of a line h) on the opposite ends of the free layer. The extended portion has a length $L_{fe}$ and occupies a part of the ferromagnetic free layer 20. That is, the extended portion is synonymous to a projected length extending further from the end of the ferromagnetic pinned layer 40.

The longitudinal length $L_f$ of the ferromagnetic free layer 20 is set to be of the order of 0.5 to 20 µm. Moreover, the length $L_{fe}$ of the extended portion of the ferromagnetic free layer 20, which is determined in relation to the longitudinal length $L_p$ of the ferromagnetic pinned layer 40, is set to be of the order of 0.1 to 5 µm.

The bias applying means 61, 61 are connected to the extended portions of the opposite ends of the ferromagnetic free layer 20 in a laminated state. Since laminated portions of the bias applying means 61, 61 are exchange-coupled to extended portions 21, the magnetization direction is fixed in the direction of the arrow (α). As shown in FIG. 2, each of the bias applying means 61, 61 is formed such that a predetermined space D is secured from the corresponding longitudinal end of the ferromagnetic pinned layer 40.

The predetermined space D is a necessary space for preventing a TMR change ratio from being lowered. Upon determining a head design specification, a value of D should be set to a length which does not substantially lower TMR change ratio characteristics. It is preferable that a concrete numeric value is appropriately set depending on the head specification, such as materials and set dimensions of constituting members for use. As a preferred example of an experimentally found numeric value, the predetermined space D is set to be 0.02 µm or more, particularly in a range of 0.02 µm to 0.3 µm, more preferably 0.02 µm to less than 0.15 µm. If the value of D is less than 0.02 µm, so-called "extra current channel effects" phenomenon tends to be caused to lower the TMR change ratio. On the other hand, if the value of D excessively increases to exceed 0.3 µm, an effective track width is unfavorably expanded to result in failure to meet with future requirement of high density recording. If a concentrated attention is paid to the effective track width, the D value is preferably set to be in a range of 0.02 µm to less than 0.15 µm.

Moreover, the thickness of the ferromagnetic free layer 20 in the present invention is set to be in a range of 2 to 50 nm, preferably 4 to 30 nm, more preferably 6 to 20 nm. If the thickness is less than 2 nm, it is difficult to set the longitudinal length of the ferromagnetic free layer 20 to be sufficiently large in view of a film formation technique. If the thickness exceeds 50 nm, dispersion of electronic polarizability is produced due to property variance within the ferromagnetic free layer, resulting in reduction of the TMR change ratio.

The entire constitution of the TMR head 1 shown in FIG. 1 will briefly be described. The tunnel multilayered film 3 is electrically connected to a pair of electrodes/shield layers 71, 75 which are disposed to substantially sandwich the tunnel multilayered film 3 therebetween in a vertical direction of FIG. 1. A lower gap layer 80 is formed between the electrode/shield layer 71 positioned below in FIG. 1 and the bias magnetic field applying layer 10 (antiferromagnetic layer 15). The lower gap layer 80 is formed of a nonmagnetic and conductive material. The lower gap layer 80 has functions for preventing magnetic leak toward the electrode/shield layer 75, adjusting a distance between the pair of electrodes/shield layers 71, 75 and the position of the tunnel multilayered film 3, and preventing a tunnel current from becoming non-uniform.

Furthermore, insulating layers 91, 91 are formed to cover the pair of bias applying means 61, 61 disposed on opposite sides of the tunnel multilayered film 3 on the lower gap layer 80, lower electrode/shield layer 71, lower gap layer 80, free layer 20, and bias magnetic field applying layer 10.

Each of the ferromagnetic free layer 20 and ferromagnetic pinned layer 40 is made preferably of a high spin polarization material, such as Fe, Co, Ni, FeCo, NiFe, CoZrNb, and FeCoNi in order to obtain a high TMR change ratio. These layers may be in the form of a laminate having two or more layers. The thickness of the ferromagnetic free layer 20 is set to be in a range of 2 to 50 nm, preferably 6 to 20 nm. An excessive thickness of the film tends to lower an output of a time of a head operation. Moreover, if the thickness is excessively small, magnetic properties become unstable and noise of the time of the head operation disadvantageously increases. The thickness of the ferromagnetic pinned layer 40 is set to be in a range of 1 to 10 nm, preferably 2 to 5 nm. If the thickness is excessively large, the pinning of magnetization by the pinning layer 50 is weakened. Furthermore, if the film thickness is excessively small, the TMR change ratio tends to decrease.

The pinning layer 50 for pinning the magnetization of the ferromagnetic pinned layer 40 is not particularly limited as long as a pinning function is fulfilled, but an antiferromagnetic material is usually used. The thickness is usually of the order of 6 to 30 nm.

Now, a ferromagnetic tunnel magnetoresistive effect will briefly be described. The ferromagnetic tunnel magnetoresistive effect is a phenomenon in which a current is passed between the pair of ferromagnetic layers 20 and 40 sandwiching the tunnel barrier layer 30 therebetween in a lamination direction, and the tunnel current flowing through the tunnel barrier layer changes depending upon a relative angle of magnetization between the ferromagnetic layers 20 and 40. This tunnel barrier layer 30 is a thin insulating film, and an electron can pass through the layer while keeping spinning by the tunnel magnetoresistive effect. When the ferromagnetic layers 20 and 40 are parallel in magnetization to each other (or a relative magnetization angle therebetween is small), a probability of electron tunneling is high, and resistance of the current flowing between the layers is reduced. Conversely, when the ferromagnetic layers 20 and 40 are antiparallel in magnetization to each other (or the relative magnetization angle is large), the probability of electron tunneling is lowered, and therefore the resistance of the current flowing between the layers increases. When a change of the resistance based on the change of the relative angle of the magnetization is utilized, for example, an external magnetic field is detected.

The tunnel barrier layer 30 sandwiched between the two ferromagnetic layers 20 and 40 is constituted of $Al_2O_3$, NiO, GdO, MgO, $Ta_2O_5$, $MoO_2$, $TiO_2$, $WO_2$, or the like. The thickness of the tunnel barrier layer 30 is desired to be as thin as possible for reduction of the resistance of the element. However, if the thickness becomes too small to generate pin holes, a leak current unfavorably flows. In general, the thickness is set to about 0.5 to 2 nm.

According to one preferred embodiment of the present invention, the ferromagnetic free layer 20 may be a synthetic ferrimagnet of a three-layered laminate of NiFe layer (2 nm in thickness)/Ru layer (0.7 nm)/NiFe layer (2.5 nm). In this case, the magnetization directions of the upper and lower NiFe layers are opposite to each other. When the synthetic ferrimagnet is used, an effective thickness of the free layer can be set to be small, the magnetic field sensitivity is therefore enhanced, and a head output is advantageously increased. Moreover, such synthetic ferrimagnet may also be applied to the ferromagnetic pinned layer 40.

Each of the pair of electrodes/shield layers 71, 75 is constituted of one or more layers including NiFe (permalloy), Sendust, CoFe, or CoFeNi. The thickness of each layer is of the order of 0.4 to 4 $\mu$m.

The lower gap layer 80 is constituted of one or more layers which contains, for example, Cu, Al, Ta, Rh, Cr. In, Ir, Mg, Ru, Ti, W or Zn. The layer thickness is of the order of 10 to 30 nm.

Additionally, reference numeral 2 in FIG. 1 denotes a substrate.

Figure 3:
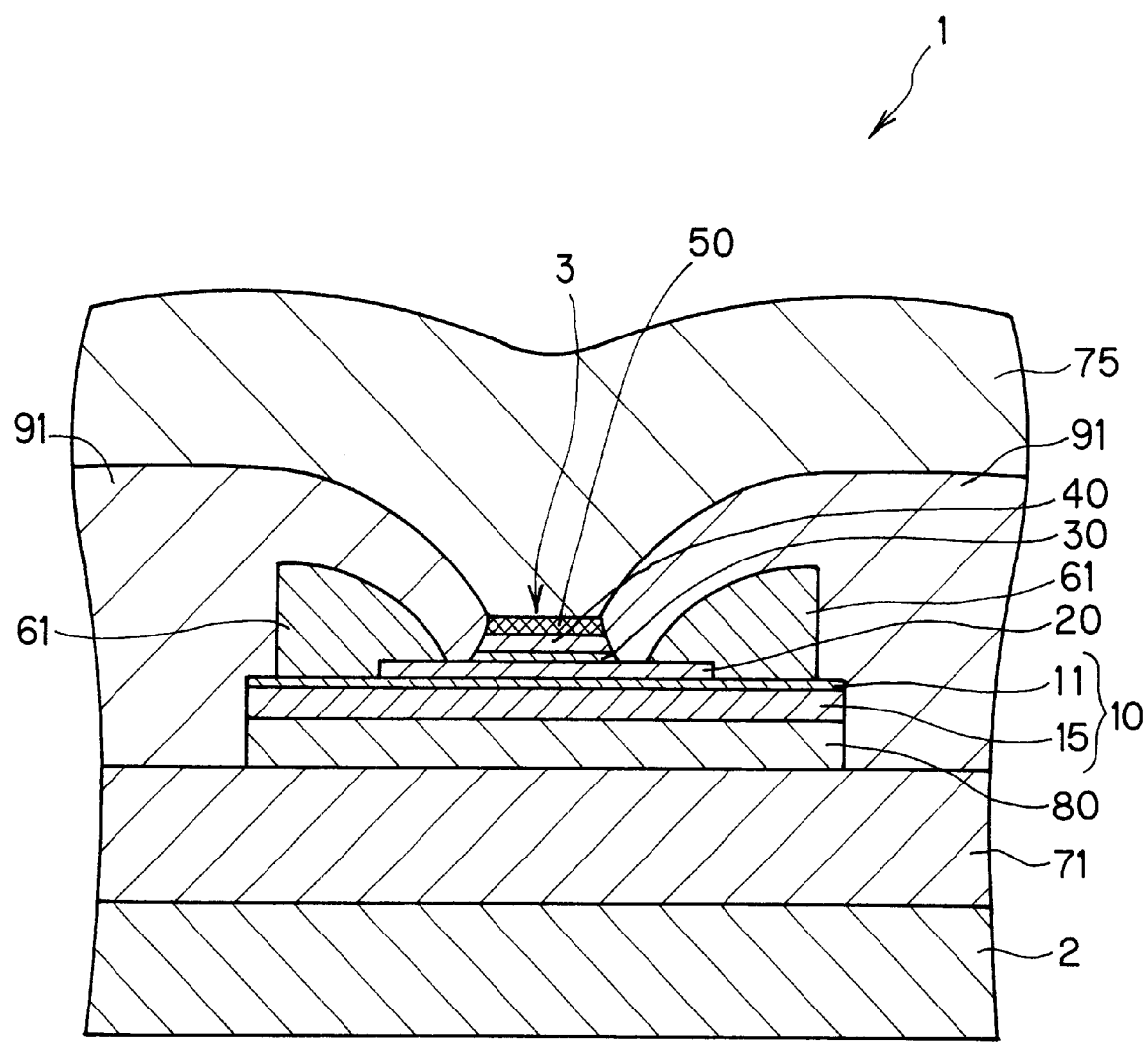
FIG. 3 is a sectional view showing another preferred embodiment of the magnetoresistive tunnel junction head of the present invention.

FIG. 3 shows a modification example of a TMR element (TMR magnetic head) structure shown in FIG. 1. The structure of the TMR element shown in FIG. 3 is basically different from that shown in FIG. 1 in that a size of the bias magnetic field applying layer 10 (laminate of the nonmagnetic noble metal layer 11 and antiferromagnetic layer 15) is adapted to the size of the lower gap layer 80, not the ferromagnetic free layer 20. Since a bias magnetic field generating layer (numeral 61 in FIG. 3) is formed remote from a lower shield (numeral 71 in FIG. 3) in this manner, the bias magnetic field can be prevented from leaking to the lower shield, and a bias can effectively and advantageously be strengthened.

Figure 4:
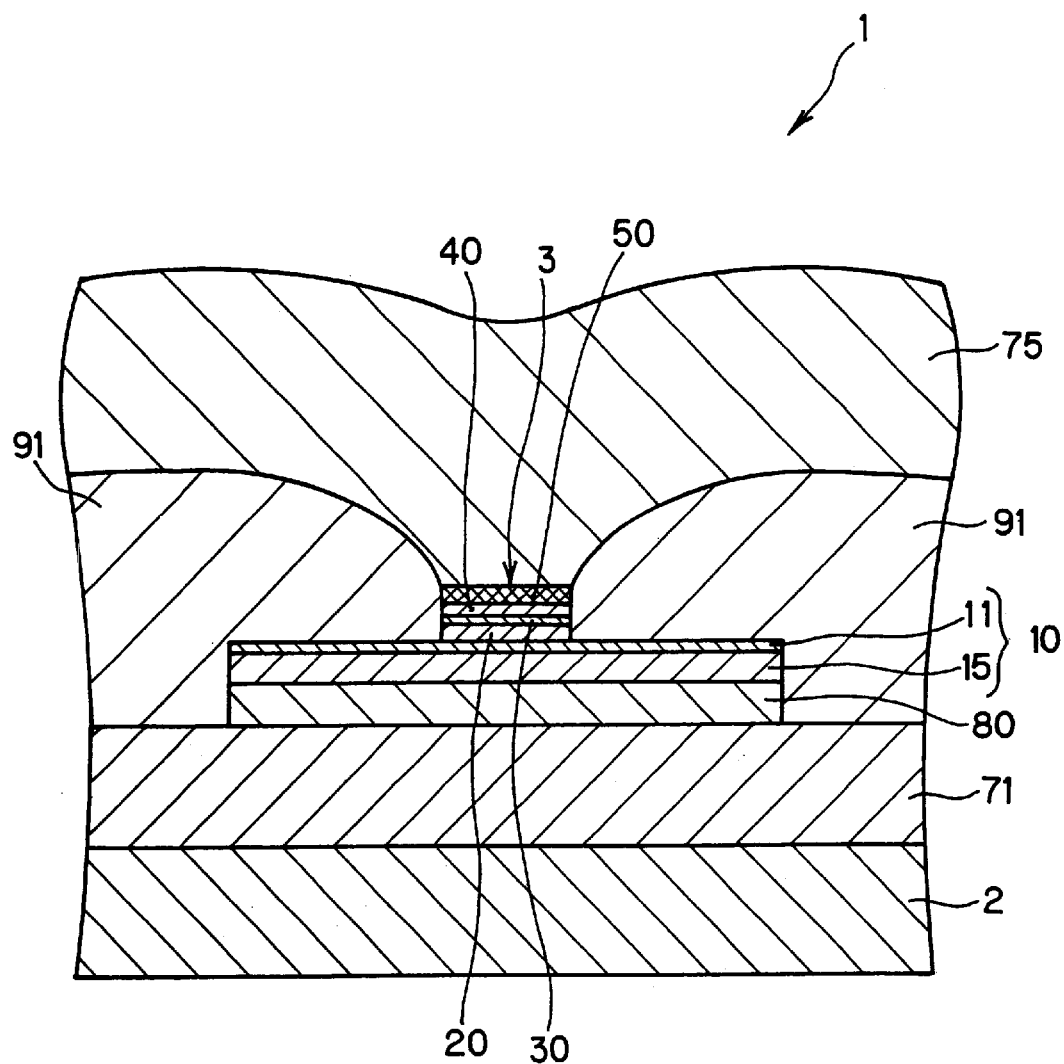
FIG. 4 is a sectional view showing another preferred embodiment of the magnetoresistive tunnel junction head of the present invention.

FIG. 4 shows a modification example of the TMR element (TMR magnetic head) structure shown in FIG. 3. The structure of the TMR element shown in FIG. 3 is basically different from that shown in FIG. 1 in that the sizes of the respective films constituting the tunnel multilayered film 3 are set to be the same and the bias applying means 61, 61 are removed. This can advantageously simplify a manufacturing process.

The invention of the foregoing magnetoresistive tunnel junction head will be described in further detail based on the following concrete examples.

EXPERIMENT I

Example I-1

A sample of the magnetoresistive tunnel junction head having a structure similar to that of the head structure shown in FIG. 4 was prepared. That is, the magnetic head sample having the tunnel multilayered film 3 was prepared, which was formed of: the ferromagnetic free layer 20 of a two-layered laminate of NiFe (3 nm in thickness) and CoFe (2 nm in thickness); the tunnel barrier layer 30 (aluminum oxide; 0.7 nm in thickness); the ferromagnetic pinned layer 40 whose magnetization direction is pinned/fixed in a detection magnetic field direction (CoFe; 3 nm in thickness, the pinned direction is the ($\beta$) direction in FIG. 2); and the pinning layer 50 (PtMn; 30 nm in thickness) for pinning the magnetization of the ferromagnetic pinned layer 40.

Additionally, the bias magnetic field applying layer was formed on the whole surface of the ferromagnetic free layer 20 opposite to the surface thereof contacting the tunnel barrier layer 30. The bias magnetic field applying layer 10 was formed in a structure in which the nonmagnetic noble metal layer 11 of Cu having a thickness of 2.0 nm and the antiferromagnetic layer 15 of PtMn having a thickness of 15 nm were formed in order from a ferromagnetic free layer 20 side. Moreover, the magnetization of the ferromagnetic free layer 20 was exchange-coupled to the magnetization of the antiferromagnetic layer 15 via the nonmagnetic noble metal layer 11 by the annealing treatment in the magnetic field, so that the bias magnetic field could be applied to the ferromagnetic free layer 20 (in the arrow direction of FIG. 1, arrow ($\alpha$) direction of FIG. 2).

The insulating layers 91, 91 were formed of alumina materials. Moreover, the electrodes/shield layers 71, 75 for passing the current through the tunnel multilayered film 3 were constituted of permalloy.

As shown in FIG. 4, a magnetoresistive tunnel junction head sample I-1 (Example I-1 sample) of the present invention was prepared. In this present invention head sample I-1, the conventional bias applying means (hard magnets disposed on opposite ends of the ferromagnetic free layer) were not disposed.

Example I-2

The thickness of the nonmagnetic noble metal layer 11 of Cu constituting a part of the bias magnetic field applying layer 10 was changed to 2.5 nm from 2.0 nm in Example I-1. Example I-2 sample (TMR head) was prepared similarly as Example I-1 in the other respects.

Example I-3

The material of the nonmagnetic noble metal layer 11 constituting a part of the bias magnetic field applying layer 10 was changed to Au from Cu in Example I-1, and the thickness thereof was set to 1.5 nm. Example I-3 sample (TMR head) was prepared similarly as Example I-1 in the other respects.

Example I-4

The thickness of the nonmagnetic noble metal layer 11 of Au constituting a part of the bias magnetic field applying layer 10 was changed to 2.0 nm from 1.5 nm in Example I-3. Example I-4 sample (TMR head) was prepared similarly as Example I-3 in the other respects.

Example I-5

The thickness of the nonmagnetic noble metal layer 11 of Au constituting a part of the bias magnetic field applying layer 10 was changed to 2.5 nm from 1.5 nm in Example I-3. Example I-5 sample (TMR head) was prepared similarly as Example I-3 in the other respects.

Example I-6

The thickness of the nonmagnetic noble metal layer 11 of Au constituting a part of the bias magnetic field applying layer 10 was changed to 3.0 nm from 1.5 nm in Example I-3. Example I-6 sample (TMR head) was prepared similarly as Example I-3 in the other respects.

Example I-7

The material of the nonmagnetic noble metal layer 11 constituting a part of the bias magnetic field applying layer 10 was changed to Ag from Cu in Example I-1, and the thickness thereof was set to 3.5 nm. Example I-7 sample (TMR head) was prepared similarly as Example I-1 in the other respects.

Example I-8

The thickness of the nonmagnetic noble metal layer 11 of Ag constituting a part of the bias magnetic field applying layer 10 was changed to 4.0 nm from 3.5 nm in Example I-7. Example I-8 sample (TMR head) was prepared similarly as Example I-7 in the other respects.

Example I-9

The thickness of the nonmagnetic noble metal layer 11 of Ag constituting a part of the bias magnetic field applying layer 10 was changed to 4.5 nm from 3.5 nm in Example I-7. Example I-9 sample (TMR head) was prepared similarly as Example I-7 in the other respects.

Example I-10

The thickness of the nonmagnetic noble metal layer 11 of Ag constituting a part of the bias magnetic field applying layer 10 was changed to 5.0 nm from 3.5 nm in Example I-7. Example I-10 sample (TMR head) was prepared similarly as Example I-7 in the other respects.

Comparative Example I-1

The bias magnetic field applying layer 10 in Example I-1 was not disposed. Instead of the bias means, the conventional bias applying means was disposed. That is, a pair of hard magnets each of a laminate of TiW (10 nm in thickness)/CoPt (80 nm in thickness) were formed to contact opposite ends of the ferromagnetic free layer.

Comparative Example I-2

The hard magnet was formed of a laminate of TiW (10 nm in thickness)/CoPt (160 nm in thickness) modifying the Comparative Example I-1. Comparative Example I-2 sample (TMR head) was prepared similarly as Comparative Example I-1 in the other respects.

With each of these samples, (1) head output and (2) Barkhausen noise generation ratio were obtained in the following procedure.

(1) Head Output

A sense current was determined such that an applied voltage was 400 mV, and the head was evaluated on a spin stand. A medium for use in evaluation had a magnetic film thickness (Mr*t) of 4.1 mA, and a coercive force of 335 kA/m. In the evaluation of the head, the number of rotations was set to 5400 rpm, a frequency of 4 MHz was recorded/reproduced in a position of a radius of 23 mm and an output was obtained.

(2) Barkhausen Noise Generation Ratio (%)

A waveform of the reproduced output of 4 MHz was observed in an oscilloscope, and presence/absence of Barkhausen noise was visually judged. This judgment was carried out with respect to 300 heads, and the generation ratio was calculated.

Results are shown in Table 1.

TABLE 1

| Sample No. | Hard magnet constitution | Constitution of bias magnetic field applying layer | Output ($\mu$Vpp) | Barkhausen noise generation ratio (%) |
|---|---|---|---|---|
| Example I-1 | — | Cu(2.0)/PtMn(15) | 4190 | 8.7 |
| Example I-2 | — | Cu(2.5)/PtMn(15) | 4480 | 19.3 |
| Example I-3 | — | Au(1.5)/PtMn(15) | 3910 | 7.7 |
| Example I-4 | — | Au(2.0)/PtMn(15) | 4180 | 9.3 |
| Example I-5 | — | Au(2.5)/PtMn(15) | 4330 | 10.3 |
| Example I-6 | — | Au(3.0)/PtMn(15) | 4420 | 21.3 |
| Example I-7 | — | Ag(3.5)/PtMn(15) | 4160 | 9.3 |
| Example I-8 | — | Ag(4.0)/PtMn(15) | 4290 | 11.0 |
| Example I-9 | — | Ag(4.5)/PtMn(15) | 4380 | 19.0 |
| Example I-10 | — | Ag(5.0)/PtMn(15) | 4580 | 29.7 |
| Comparative Example I-1 | TiW(10)/CoPt(80) | — | 4350 | 42.7 |
| Comparative Example I-2 | TiW(10)/CoPt(160) | — | 4120 | 32.3 |

It is seen from the results shown in Table 1 that the sample of the present invention maintains substantially the same degree of output, and has a remarkably reduced Barkhausen noise generation ratio as compared with the conventional example sample.

EXPERIMENT II

Example II-1

A sample of the magnetoresistive tunnel junction head having a structure similar to that of the head structure shown in FIG. 3 was prepared. That is, the magnetic head sample having the tunnel multilayered film 3 was prepared, which was formed of: the ferromagnetic free layer 20 of a two-layered laminate of NiFe (3 nm in thickness) and CoFe (2 nm in thickness); the tunnel barrier layer 30 (aluminum oxide; 0.7 nm in thickness); the ferromagnetic pinned layer 40 whose magnetization direction is pinned/fixed in the detection magnetic field direction (CoFe; 3 nm in thickness, the pinned direction is the (β) direction in FIG. 2); and the pinning layer 50 (PtMn; 30 nm in thickness) for pinning the magnetization of the ferromagnetic pinned layer 40.

Additionally, the bias magnetic field applying layer 10 was formed on the whole surface of the ferromagnetic free layer 20 opposite to the surface thereof contacting the tunnel barrier layer 30. The bias magnetic field applying layer 10 was formed in a structure in which the nonmagnetic noble metal layer 11 of Cu having a thickness of 2.5 nm and the antiferromagnetic layer 15 of PtMn having a thickness of 15 nm were formed in order from the ferromagnetic free layer 20 side. Moreover, the magnetization of the ferromagnetic free layer 20 was exchange-coupled to the magnetization of the antiferromagnetic layer 15 via the nonmagnetic noble metal layer 11 by the annealing treatment in the magnetic field, so that the bias magnetic field could be applied to the ferromagnetic free layer 20 (in the arrow direction of FIG. 1, arrow (α) direction of FIG. 2).

Furthermore, hard magnets 61, 61 formed of a two-layered laminate of TiW (10 nm in thickness)/CoPt (80 nm in thickness) were overlapped as the respective bias applying means 61, 61 on the opposite ends of the ferromagnetic free layer 20 in the longitudinal direction. In the structure, the bias magnetic field (arrow (α) direction) was further applied in the longitudinal direction of the ferromagnetic free layer 20 by the bias applying means 61, 61. The insulating layers 91, 91 were formed of alumina materials. Moreover, the electrodes/shield layers 71, 75 for passing the current to the tunnel multilayered film 3 were constituted of permalloy.

As shown in FIG. 3, a magnetoresistive tunnel junction head sample II-1 (Example II-1 sample) of the present invention was prepared.

Example II-2

The thickness of the nonmagnetic noble metal layer 11 of Cu constituting a part of the bias magnetic field applying layer 10 was changed to 3.0 nm from 2.5 nm in Example II-1. Example II-2 sample (TMR head) was prepared similarly as Example II-1 in the other respects.

Example II-3

The thickness of the nonmagnetic noble metal layer 11 of Cu constituting a part of the bias magnetic field applying layer 10 was changed to 3.5 nm from 2.5 nm in Example II-1. Example II-3 sample (TMR head) was prepared similarly as Example II-1 in the other respects.

Example II-4

The thickness of the nonmagnetic noble metal layer 11 of Cu constituting a part of the bias magnetic field applying layer 10 was changed to 4.0 nm from 2.5 nm in Example II-1. Example II-4 sample (TMR head) was prepared similarly as Example II-1 in the other respects.

Example II-5

The material of the nonmagnetic noble metal layer 11 constituting a part of the bias magnetic field applying layer 10 was changed to Au from Cu in Example II-1, and the thickness was set to 2.5 nm. Example II-5 sample (TMR head) was prepared similarly as Example II-1 in the other respects.

Example II-6

The thickness of the nonmagnetic noble metal layer 11 of Au constituting a part of the bias magnetic field applying layer 10 was changed to 3.0 nm from 2.5 nm in Example II-5. Example II-6 sample (TMR head) was prepared similarly as Example II-5 in the other respects.

Example II-7

The thickness of the nonmagnetic noble metal layer 11 of Au constituting a part of the bias magnetic field applying layer 10 was changed to 3.5 nm from 2.5 nm in Example II-5. Example II-7 sample (TMR head) was prepared similarly as Example II-5 in the other respects.

Example II-8

The thickness of the nonmagnetic noble metal layer 11 of Au constituting a part of the bias magnetic field applying layer 10 was changed to 4.0 nm from 2.5 nm in Example II-5. Example II-8 sample (TMR head) was prepared similarly as Example II-5 in the other respects.

Example II-9

The material of the nonmagnetic noble metal layer 11 constituting a part of the bias magnetic field applying layer 10 was changed to Ag from Cu in Example II-1, and the thickness was set to 4.5 nm. Example II-9 sample (TMR head) was prepared similarly as Example II-1 in the other respects.

Example II-10

The thickness of the nonmagnetic noble metal layer 11 of Ag constituting a part of the bias magnetic field applying layer 10 was changed to 5.0 nm from 4.5 nm in Example II-9. Example II-10 sample (TMR head) was prepared similarly as Example II-9 in the other respects.

Example II-11

The thickness of the nonmagnetic noble metal layer 11 of Ag constituting a part of the bias magnetic field applying layer 10 was changed to 5.5 nm from 4.5 nm in Example II-9. Example II-11 sample (TMR head) was prepared similarly as Example II-9 in the other respects.

Comparative Example II-1

The bias magnetic field applying layer 10 in Example II-1 was not disposed. However, a pair of hard magnets each of a laminate of TiW (10 nm in thickness)/CoPt (80 nm in thickness) for applying the bias magnetic field were left as they were, to contact opposite ends of the ferromagnetic free layer.

Comparative Example II-2

The hard magnet was formed of a laminate of TiW (10 nm in thickness)/CoPt (160 nm in thickness) modifying the Comparative Example II-1. Comparative Example II-2 sample (TMR head) was prepared similarly as Comparative Example II-1 in the other respects.

With each of these samples, (1) head output and (2) Barkhausen noise generation ratio were obtained in the aforementioned procedure.

Results are shown in Table 2.

TABLE 2

| Sample No. | Hard magnet constitution | Constitution of bias magnetic field applying layer | Output ($\mu$Vpp) | Barkhausen noise generation ratio (%) |
|---|---|---|---|---|
| Example II-1 | TiW(10)/CoPt(80) | Cu(2.5)/PtMn(15) | 4130 | 1.7 |
| Example II-2 | TiW(10)/CoPt(80) | Cu(3.0)/PtMn(15) | 4300 | 12.3 |
| Example II-3 | TiW(10)/CoPt(80) | Cu(3.5)/PtMn(15) | 4270 | 15.7 |
| Example II-4 | TiW(10)/CoPt(80) | Cu(4.0)/PtMn(15) | 4420 | 20.7 |
| Example II-5 | TiW(10)/CoPt(80) | Au(2.5)/PtMn(15) | 4040 | 2.3 |
| Example II-6 | TiW(10)/CoPt(80) | Au(3.0)/PtMn(15) | 4120 | 4.3 |
| Example II-7 | TiW(10)/CoPt(80) | Au(3.5)/PtMn(15) | 4260 | 17.7 |
| Example II-8 | TiW(10)/CoPt(80) | Au(4.0)/PtMn(15) | 4230 | 23.7 |
| Example II-9 | TiW(10)/CoPt(80) | Ag(4.5)/PtMn(15) | 4110 | 8.3 |
| Example II-10 | TiW(10)/CoPt(80) | Ag(5.0)/PtMn(15) | 4270 | 11.3 |
| Example II-11 | TiW(10)/CoPt(80) | Ag(5.5)/PtMn(15) | 4240 | 16.0 |
| Comparative Example II-1 | TiW(10)/CoPt(80) | — | 4350 | 42.7 |
| Comparative Example II-2 | TiW(10)/CoPt(160) | — | 4120 | 32.3 |

It is seen from the results shown in Table 2 that the sample of the present invention maintains substantially the same degree of output, and has a remarkably reduced Barkhausen noise generation ratio as compared with the conventional example sample.

EXPERIMENT III

To realize a special operation of the nonmagnetic noble metal layer 11 in the present invention, that is, the magnetic exchange coupling between the ferromagnetic free layer 20 and the antiferromagnetic layer 15, the annealing treatment for determining the applying direction of the bias magnetic field can be performed at the temperature lower than the temperature which is to be originally used. An experiment for confirming this was conducted. A laminated film having the following constitution was formed. A numeric value within parentheses indicates a film thickness (unit: nm).
(Laminate Film Constitution)
  Ta(5)/NiFe(1.5)/PtMn(25)/Cu(X)/Co(1)/NiFe(7)/Ta(5)

In the above constitution, NiFe(1.5) is the underlayer, PtMn(25)/Cu(X) is the bias magnetic field applying layer 10 (PtMn(25) is the antiferromagnetic layer 15, Cu(X) is the nonmagnetic noble metal layer 11), Co(1)/NiFe(7) is the ferromagnetic free layer 20, and Ta(5) on opposite sides is the protective layer. For Cu(X), the thickness X of the Cu layer is arbitrarily set as shown in Table 3.

The above laminated film was used to conduct an annealing experiment in the following magnetic field.

First, the annealing treatment (hereinafter referred to simply as "O-Anneal") was performed at 250° C. for five hours, while applying a magnetic field of 3 kOe (237 kA/m) to one direction of a film surface (e.g., (β) direction of FIG. 2). Subsequently, the annealing treatment (hereinafter referred to simply as "Free-Anneal") was performed at 210° C. for two hours, while applying the magnetic field of 200 Oe (15.8 kA/m) to (α) direction of FIG. 2, which is a direction being changed by 90 degrees with respect to the (β) direction.

When each annealing operation ended, Hin (Oe) was measured in the following procedure. Here, Hin (Oe) indicates a degree of magnetic field generated from the antiferromagnetic layer PtMn(25).

Measurement of Hin (Oe)

(i) An MH loop is measured, while the magnetic field is applied in parallel to the magnetic field applied during O-Anneal process. When the exchange coupling is induced along this direction, the measured MH loop shifts in a negative direction from a position of zero magnetic field. A shift amount corresponds to Hin.

(ii) When the shift of the MH loop is not observed in the above (i), the exchange coupling is not induced in the direction. Then, the sample is rotated by 90 degrees, the magnetic field is applied in parallel to the magnetic field applied during Free-Anneal process, and the MH loop is measured. When the exchange coupling is induced along this direction, the measured MH loop shifts in the negative direction from the position of zero magnetic field. The shift amount corresponds to Hin.

Results are shown in Table 3. Additionally, for a sample 6 (comparative example) in Table 3, a Cu film is changed to a Ta film.

TABLE 3

| | Cu thickness | Hin (Oe) | |
|---|---|---|---|
| Sample ID | (nm) | O-Anneal | Free-Anneal |
| 1 | 2 | 77.6 | 69.7 |
| 2 | 2.4 | 44.0 | 40.8 |
| 3 | 2.6 | 34.9 | 32.9 |
| 4 | 2.8 | 31.6 | 30.3 |
| 5 | 3.0 | 23.6 | 20.4 |
| 6 (comparative) | change to Ta(1 nm) | 0 | 0 |

It is seen from the result of Table 3 that "O-Anneal" of 3 kOe is first performed in one direction of the film surface (e.g., (β) direction of FIG. 2) at 250° C. for five hours, subsequently "Free-Anneal" of 200 Oe is performed in a direction crossing at right angles to the direction (e.g., (α) direction of FIG. 2) at 210° C. for two hours, the magnetization then turns to "Free-Anneal" direction, and the value Hin (Oe) is not remarkably lowered. Furthermore, when the thickness of the nonmagnetic noble metal layer 11 is appropriately changed, the value of Hin (Oe) can arbitrarily be changed.

In general, for an antiferromagnetic material of PtMn, an annealing effect of the annealing treatment is considered to start to appear at temperature of 230° C. or more. However, as seen from the results of Table 3, the annealing effect appears at temperature of 210° C. at which the annealing effect is originally considered not to appear. This is supposedly attributed to the bias magnetic field applying layer 10 constituted by combining the antiferromagnetic layer 15 and nonmagnetic noble metal layer 11, particularly to the existence of the nonmagnetic noble metal layer 11.

Such phenomenon remarkably advantageously acts in preparation of the TMR magnetic head from a viewpoint of enhancement of productivity. That is, the annealing treatment for pinning the magnetization of the ferromagnetic pinned layer 40 by the pinning layer 50 is performed at a high temperature around 250° C. (the magnetization direction is the (β) direction of FIG. 2). Subsequently, the annealing treatment for applying the bias magnetic field to the ferromagnetic free layer 20 is performed at a low temperature around 210° C. Then, after the magnetization direction of the ferromagnetic free layer 20 once turns to the (β) direction of FIG. 2, the direction can be changed to the (α) direction of FIG. 2 by the subsequent low-temperature annealing treatment. The magnetization direction of the ferromagnetic pinned layer 40 remains in the (β) direction.

In general, it has heretofore been considered that the magnetization of the (β) direction of the ferromagnetic free layer 20 once influenced by high-temperature annealing of approximate 250° C. does not change its direction to the (α) direction in the annealing treatment at the low temperature of approximate 210° C.

The effect of the present invention is apparent from the aforementioned result. That is, according to the present invention, there is provided the magnetoresistive tunnel junction element having the tunnel multilayered film in which the tunnel barrier layer, and the ferromagnetic free layer and ferromagnetic pinned layer formed to sandwich the tunnel barrier layer therebetween are laminated, wherein the pinning layer for pinning magnetization of the ferromagnetic pinned layer is laminated on the surface of the ferromagnetic pinned layer opposite to the surface thereof contacting the tunnel barrier layer, the bias magnetic field applying layer is formed on the surface of the ferromagnetic free layer opposite to the surface thereof contacting the tunnel barrier layer, the bias magnetic field applying layer is a laminate of the nonmagnetic noble metal layer and antiferromagnetic layer, and the ferromagnetic free layer is magnetically exchange-coupled to the antiferromagnetic layer via the nonmagnetic noble metal layer so that the bias magnetic field can be applied to the ferromagnetic free layer. Therefore, there can be obtained the magnetoresistive tunnel junction element superior in stability of the magnetization rotating operation of the ferromagnetic free layer with respect to the magnetic field signal, and also superior in yield of a product. Productivity is also-remarkably satisfactory.

What is claimed is:

1. A magnetoresistive tunnel junction element comprising a tunnel multilayered film in which a tunnel barrier layer, and a ferromagnetic free layer and a ferromagnetic pinned layer formed to sandwich the tunnel barrier layer therebetween are laminated, wherein a pinning layer for pinning magnetization of said ferromagnetic pinned layer is laminated on the surface of said ferromagnetic pinned layer opposite to the surface thereof contacting the tunnel barrier layer, a bias magnetic field applying layer is formed on the surface of said ferromagnetic free layer opposite to the surface thereof contacting the tunnel barrier layer, the bias magnetic field applying layer is a laminate of a nonmagnetic noble metal layer and an antiferromagnetic layer, and said ferromagnetic free layer is magnetically exchange-coupled to the antiferromagnetic layer via the nonmagnetic noble metal layer so that a bias magnetic field can be applied to said ferromagnetic free layer.

2. The magnetoresistive tunnel junction element according to claim 1 wherein said nonmagnetic noble metal layer is constituted of Cu, Ag, Au, Ir, Ru, Rh or Cr.

3. The magnetoresistive tunnel junction element according to claim 1 wherein a thickness of said nonmagnetic noble metal layer is in a range of 0.5 to 6.0 nm, so that a strength of magnetic exchange coupling between said antiferromagnetic free layer and the antiferromagnetic layer can arbitrarily be set.

4. The magnetoresistive tunnel junction element according to claim 1 wherein said bias magnetic field applying layer contacts the whole one surface of said ferromagnetic free layer.

5. The magnetoresistive tunnel junction element according to claim 1 wherein a pair of bias applying means are formed to contact opposite ends of said ferromagnetic free layer in a direction in which the bias magnetic field is applied, and the bias magnetic field is applied to the ferromagnetic free layer by the bias applying means.

6. The magnetoresistive tunnel junction element according to claim 1 wherein extended portions extended beyond positions of opposite ends of said ferromagnetic pinned layer in a longitudinal direction (bias magnetic field applying direction) are formed on opposite ends of said ferromagnetic free layer, bias applying means is formed to partially contact the extended portion of the ferromagnetic free layer, and the bias magnetic field is applied to the ferromagnetic free layer by the bias applying means.

7. The magnetoresistive tunnel junction element according to claim 6 wherein said bias applying means includes a hard magnet layer or an antiferromagnetic layer.

8. The magnetoresistive tunnel junction element according to claim 1 wherein said ferromagnetic free layer is a synthetic ferrimagnet.

9. The magnetoresistive tunnel junction element according to claim 1 wherein said tunnel multilayered film is electrically connected to a pair of electrodes disposed opposite to each other via the tunnel multilayered film.

10. The magnetoresistive tunnel junction element according to claim 1 wherein said nonmagnetic noble metal layer promotes the magnetic exchange coupling between said ferromagnetic free layer and the antiferromagnetic layer.

11. A magnetoresistive tunnel junction head comprising: a magnetoresistive tunnel junction element including a tunnel multilayered film; and an electrode for passing a current through said tunnel multilayered film, wherein said tunnel multilayered film comprises a tunnel barrier layer, and a ferromagnetic free layer and a ferromagnetic pinned layer formed to sandwich the tunnel barrier layer therebetween, a pinning layer for pinning magnetization of said ferromagnetic pinned layer is laminated on the surface of said ferromagnetic pinned layer opposite to the surface thereof contacting the tunnel barrier layer, a bias magnetic field applying layer is formed on the surface of said ferromagnetic free layer opposite to the surface thereof contacting the tunnel barrier layer, the bias magnetic field applying layer is a laminate of a nonmagnetic noble metal layer and an antiferromagnetic layer, and said ferromagnetic free layer is magnetically exchange-coupled to the antiferromagnetic layer via the nonmagnetic noble metal layer so that a bias magnetic field can be applied to said ferromagnetic free layer.

* * * * *